United States Patent [19]
Hato et al.

[11] Patent Number: 5,950,103
[45] Date of Patent: Sep. 7, 1999

[54] MANUFACTURE OF DIELECTRIC OXIDE LAMINATION STRUCTURE AND ELECTRONIC CIRCUIT DEVICE

[75] Inventors: Tsunehiro Hato; Chikako Yoshida, both of Kawasaki, Japan

[73] Assignee: Fujitsu Limited, Kawasaki, Japan

[21] Appl. No.: 08/726,174

[22] Filed: Oct. 4, 1996

[30] Foreign Application Priority Data

Apr. 30, 1996 [JP] Japan ................................. 8-109964

[51] Int. Cl.⁶ .............................................. H01L 21/4763
[52] U.S. Cl. ........................ 438/638; 438/640; 438/763
[58] Field of Search .................................. 438/406, 454, 438/393, 396, 366, 367, 546, 763, 637, 638, 640

[56] References Cited

U.S. PATENT DOCUMENTS

| | | | |
|---|---|---|---|
| 4,440,841 | 4/1984 | Tabuchi | 430/5 |
| 5,065,275 | 11/1991 | Fujisaki et al. | 361/321 |
| 5,643,806 | 7/1997 | Miwa et al. | 438/366 |
| 5,663,089 | 9/1997 | Tomozawa et al. | 427/576 |
| 5,780,351 | 7/1998 | Arita et al. | 438/396 |

*Primary Examiner*—Chandra Chaudhari
*Assistant Examiner*—Reneé R. Berry
*Attorney, Agent, or Firm*—Armstrong, Westerman, Hattori, McLeland & Naughton

[57] ABSTRACT

An impurity supply film made of dielectric oxide material is deposited on the surface of an underlying substrate having a surface layer made of different dielectric oxide material. An impurity absorption film made of the same dielectric oxide material as the surface layer of the underlying substrate is deposited on the impurity supply film. The underlying substrate is heated to replace a fraction of at least one type of constituent atoms other than oxygen atoms in the impurity supply film by a fraction of at least one type of constituent atoms other than oxygen atoms in the surface layer of the underlying substrate and in the impurity absorption film, for the whole thickness of the impurity supply film. A method is provided by which impurities are selectively doped in a dielectric oxide material without leaving an electrical barrier on the surface of the material.

14 Claims, 3 Drawing Sheets

MANUFACTURE OF DIELECTRIC OXIDE LAMINATION STRUCTURE AND ELECTRONIC CIRCUIT DEVICE

BACKGROUND OF THE INVENTION a) Field of the Invention

The present invention relates to manufacture of a dielectric oxide lamination structure and an electronic circuit device using this structure, and more particularly to manufacture of a dielectric oxide lamination structure having a doped layer for generating carriers and an electronic circuit device using this structure.

b) Description of the Related Art

Techniques are now being studied which fabricate electronic circuit devices by using superconductive oxide and dielectric oxide. If impurities such as Nb and La are doped in a dielectric oxide such as $SrTiO_3$, carriers increase and the dielectric oxide operates as semiconductor.

Methods of doping impurities in dielectric oxide material to generate carriers are known. In one method, metal material is doped during the growth of monocrystal, and in another method, dielectric oxide material is diffused in different dielectric oxide material. If impurities are doped in dielectric oxide material by using the method of doping metal material during the growth of monocrystal, the metal material is doped in the whole region of crystal. This method is therefore difficult to be applied to various types of electronic circuit devices.

An example of the method of diffusing dielectric oxide material into different dielectric oxide material is to deposit an $LaTiO_3$ film on an $SrTO_3$ substrate and perform heat treatment. However, impurities such as La have a short diffusion length in $SrTiO_3$, so that they are more difficult to diffuse in $SrTiO_3$ than impurities diffused in Si. Further, in order to deposit a film of $LaTiO_3$, the film thickness of about 1 nm or thicker is required. Therefore, after La is diffused in an $SrTiO_3$ substrate by heat treatment, a thin layer of $LaTiO_3$ is left on the surface of the substrate, and this layer is difficult to be removed. This $LaTiO_3$ layer hinders good electrical contact with the diffusion region and an electrode on the $LaTiO_3$ layer.

SUMMARY OF THE INVENTION

It is an object of the present invention to provide a method of partially doping impurities in dielectric oxide material without leaving an electrical barrier on the surface of the dielectric oxide material.

It is another object of the present invention to provide an electronic circuit device having a semiconductor layer formed by partially doping impurities into dielectric oxide material.

According to one aspect of the present invention, there is provided a method of manufacturing a dielectric oxide lamination structure comprising the steps of: depositing an impurity supply film made of dielectric oxide material on the surface of an underlying substrate having a surface layer made of different dielectric oxide material; depositing an impurity absorption film made of the same dielectric oxide material as the surface layer of the underlying substrate, on the impurity supply film; and heating the underlying substrate to replace a fraction of at least one type of constituent atoms other than oxygen atoms in the impurity supply film by a fraction of at least one type of constituent atoms other than oxygen atoms in the surface layer of the underlying substrate and in the impurity absorption film, for the whole thickness of the impurity supply film.

Since the impurity absorption film is formed on the impurity supply film, impurities in the impurity supply film diffuse not only into the lower level substrate surface layer but also in the higher level impurity absorption film. Constituent atoms in the substrate surface layer and in the impurity absorption film also diffuse into the impurity supply film. Accordingly, a fraction of constituent atoms in the impurity supply film can be replaced by a fraction of constituent atoms in the underlying substrate, for the whole thickness of the impurity supply film. As a fraction of constituent atoms are replaced for the whole thickness thereof, it becomes easy to form an electrode on the impurity doped region formed in the substrate surface layer and have an electrical contact.

According to another aspect of the present invention, there is provided an electronic circuit device comprising: an underlying substrate made of a dielectric oxide material, the underlying substrate having a semiconductor layer to a certain depth from the surface of the underlying substrate, the semiconductor layer having a potential well formed by doping impurities or by replacing a portion of at least one type of constituent atoms other than oxygen atoms of the underlying substrate by other atoms; a dielectric film disposed on the surface of the underlying substrate and made of a different dielectric oxide material having a dielectric constant smaller than the dielectric constant of the underlying substrate; and an electrode disposed on the dielectric film and made of a superconductive oxide material.

As a negative voltage as referenced to a potential of the underlying substrate is applied to the electrode and the thickness of a potential barrier by the dielectric film and the surface layer of the underlying substrate becomes so thin as the quantum effects can be obtained, electrons on the electrode tunnel through the potential barrier and reach the semiconductor layer. Since the potential barrier at the interface between the semiconductor layer and underlying substrate is relatively small, most of electrons that have reached the semiconductor layer flow into the underlying substrate. Therefore, as an applied voltage exceeds the voltage allowing electron tunneling, current increases abruptly.

As a positive voltage is applied to the electrode, electrons in the underlying substrate pass over the potential barrier between the underlying substrate and semiconductor layer and move to the semiconductor layer. As the thickness of a potential barrier by the dielectric film and the surface layer of the underlying substrate becomes so thin as the quantum effects can be obtained, electrons that have moved into the semiconductor layer tunnel through the potential barrier layer and reach the electrode. Therefore, as an applied voltage exceeds the voltage allowing electrons in the underlying substrate to pass over the potential barrier, current increases abruptly.

As above, a semiconductor region easy to have an electrical contact can be realized by doping impurities into the surface layer of a dielectric oxide material. A semiconductor region doped with impurities can be formed to a certain depth from the surface of the dielectric oxide material.

DETAILED DESCRIPTION OF THE PREFERRED EMBODIMENTS

A method of doping impurities into dielectric oxide material according to an embodiment of the invention will be described with reference to FIGS. 1A to 1C.

Figure 1A:
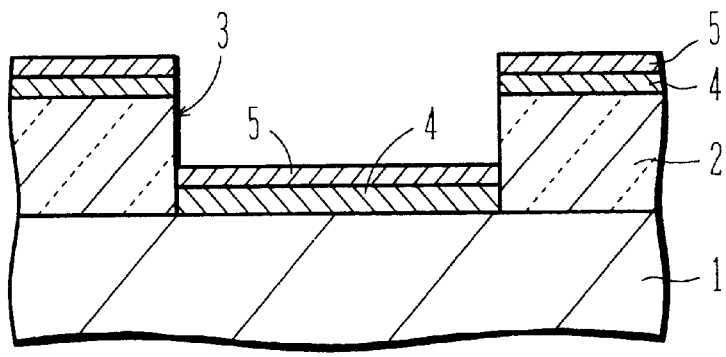
FIGS. 1A to 1C are cross sectional views of a substrate illustrating a method of doping impurities according to a first embodiment of the invention.

As shown in FIG. 1A, on an $SrTiO_3$ substrate 1, a mask layer 2 of $CeO_2$ is deposited about 50 nm thick. Depositing this mask layer 2 is preformed, for example, by laser abrasion under the conditions of a target of $CeO_2$, an ultraviolet laser beam of KrF excimer laser at an energy density of $2J/cm^2$, a substrate temperature of 860° C., and an atmospheric pressure of 10 mTorr.

A predetermined area of the mask layer 2 is covered with a resist pattern, and an opening 3 is formed in the mask layer 2 by ion milling using Ar. After the opening 3 is formed, the resist pattern is removed.

On the surface of the $SrTiO_3$ substrate 1 exposed at the bottom of the opening 3 and on the upper surface of the mask layer 2, an impurity supply film 4 of $LaTiO_3$ is deposited about 2.5 nm thick. Depositing the impurity supply film 4 is performed, for example, by laser abrasion under the conditions of a target of $LaTiO_3$, an ultraviolet laser beam of KrF excimer laser at an energy density of $2J/cm^2$, a substrate temperature of about 910° C., and an atmospheric pressure of about $1 \times 10^{-5}$ Torr. After the impurity supply film 4 is deposited, a first heat treatment is performed for about 30 minutes while the substrate temperature is maintained at 910° C. During the deposition of the impurity supply film 4 and during the heat treatment after the deposition, La atoms in the impurity supply film 4 diffuse into the surface layer of the $SrTiO_3$ substrate, and some Sr atoms are replaced by La atoms, in the surface layer of the $SrTiO_3$ substrate. At the same time, Sr atoms diffuse from the $SrTiO_3$ substrate into the impurity supply film 4.

An impurity absorption film 5 of $SrTiO_3$ is deposited about 2.5 nm thick on the impurity supply film 4. Depositing the impurity absorption film 5 is performed, for example, by laser abrasion under the conditions of a target of $SrTiO_3$, an ultraviolet laser beam of KrF excimer laser at an energy density of $2J/cm^2$, a substrate temperature of about 860° C., and an oxide atmospheric pressure of about $1 \times 10^{-2}$ Torr. After the impurity absorption film 5 is deposited, a second heat treatment is performed for about 15 minutes while the substrate temperature is maintained at 850° C.

During the deposition of the impurity absorption film 5 and during the second heat treatment, La atoms in the impurity supply film 4 diffuse into the $SrTiO_3$ substrate 1 and into the impurity absorption film 5, and some Sr atoms in the surface layer of the $SrTiO_3$ substrate 1 and in the impurity absorption film 5 are replaced by La atoms.

It is not necessarily required to heat the substrate during the deposition of the impurity supply film 4 and impurity absorption film 5. However, if the substrate is heated, La atoms can be efficiently diffused. It is preferable to set the substrate temperature to 500° C. or higher. In order to promote diffusion of La atoms during the deposition of the impurity supply film 4, it is preferable to set the atmospheric pressure to $1 \times 10^{-1}$ Torr or lower. In order to prevent carriers from vanishing during the deposition of the $SrTiO_3$ film, it is preferable to set the $O_2$ partial pressure in the atmosphere to $1 \times 10^{-1}$ Torr or lower. In order to prevent carriers from generating caused by insufficient oxygen during the deposition of the $SrTiO_3$ film, it is preferable to set the $O_2$ partial pressure in the atmosphere to $1 \times 10^{-2}$ Torr or higher.

Figure 1B:
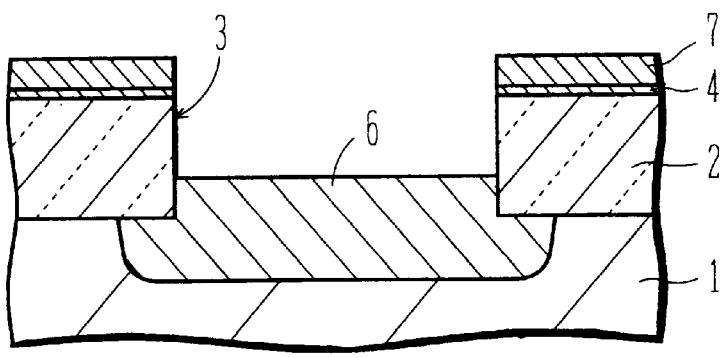

FIG. 1B is a cross sectional view of the substrate after the second heat treatment. In the region where the opening 3 is formed, the impurity absorption film 5 and impurity supply film 4 extinguish, and an impurity doped region 6 is formed in which some Sr atoms in the surface layer of the $SrTiO_3$ substrate and in the impurity absorption film 5 are replaced by La atoms. On the upper surface of the mask layer 2, some Sr atoms are replaced by La atoms over the whole depth of the impurity absorption film 5 and an $(La, Sr)TiO_3$ film 7 is formed. A portion of the impurity supply film 4 is left between the mask layer 2 and $(La, Sr)TiO_3$ film 7.

As above, in a partial region of the surface layer of the $SrTiO_3$ substrate 1, the impurity doped region 6 of $(La, Sr)TiO_3$ is formed to a thickness of about 10 nm. This impurity doped region 6 with some Sr atoms of $SrTiO_3$ being replaced by La atoms becomes an n-type semiconductor.

Figure 1C:
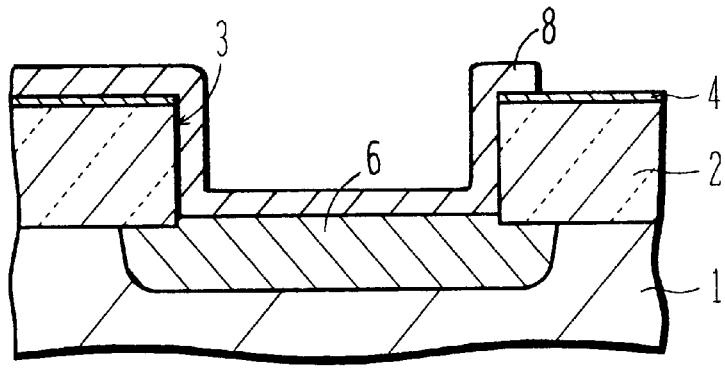

As shown in FIG. 1C, the $(La, Sr)TiO_3$ film 7 on the upper surface of the mask layer 2 is removed by ion milling using Ar. At this time, part of the surface layer of the impurity doped region 6 exposed at the bottom of the opening 3 is also removed. The bottom of the opening 3 may be covered with a resist pattern so as not to remove the upper portion of the surface layer of the impurity doped region 6.

A wiring layer is deposited over the whole surface of the substrate and patterned to form a wiring 8. This wiring 8 may be made of, for example, superconductive material such as YBCO or Nb, conductive oxide material such as $In_2O_x$, $ZnAlO_x$, or metal such as Cu, Al, and Au.

In the above embodiment, during the second heat treatment, La atoms in the impurity absorption film 4 shown in FIG. 1A diffuse not only into the lower level $SrTiO_3$ substrate 1 but also into the higher level impurity absorption film 5. Therefore, the impurity supply film 4 of $LaTiO_3$ at the region where the opening 3 is formed can be extinguished as shown in FIG. 1B. The impurity absorption film 5 of $SrTiO_3$ can also be extinguished.

In the above manner, the impurity doped region 6 of $(La, Sr)TiO_3$ can be formed without leaving an $LaTiO_3$ region on the surface of the $SrTiO_3$ substrate 1. As shown in FIG. 1C, an $LaTiO_3$ region is not left on the bottom of the opening 3, even if the impurity supply film 4 of $LaTiO_3$ is left on the upper surface of the mask layer 2 after the $(La, Sr)TiO_3$ film on the upper surface of the mask layer 2 is removed by ion milling. It is therefore very easy to form a wiring on the surface of the impurity doped region 6 and have an electrical contact. In order to change the whole thicknesses of the impurity supply film 4 and impurity absorption film 5 to $(La, Sr)TiO_3$, it is preferable to set each thickness to 5 nm or thinner.

Next, a method of doping impurities into dielectric oxide material according to another embodiment will be described with reference to FIGS. 2A to 2D.

Figure 2A:
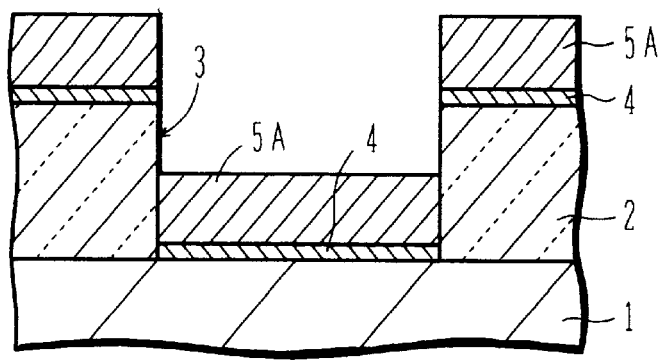
FIGS. 2A to 2D are cross sectional views of a substrate illustrating a method of doping impurities according to a second embodiment of the invention.

As shown in FIG. 2A, the laminate structure which is generally the same as that shown in FIG. 1A is formed. The thickness of the impurity absorption film 5 shown in FIG. 1A is about 2.5 nm, whereas the thickness of an impurity absorption film 5A shown in FIG. 2A is about 20 nm. The other structures are the same as those shown in FIG. 1A.

Figure 2B:
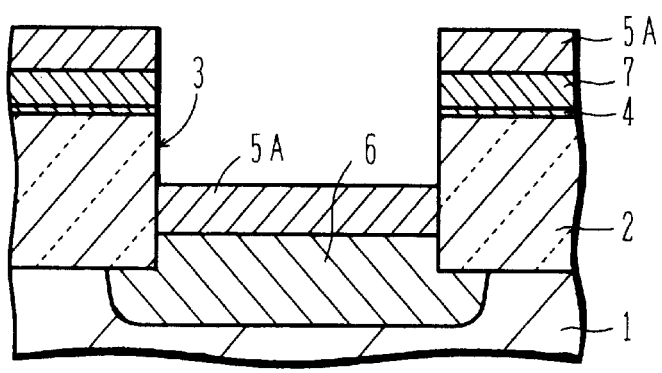

FIG. 2B is a cross sectional view of the substrate after the heat treatment after the deposition of the impurity absorption film 5A. In FIG. 1B, the whole thickness of the impurity absorption film 5 at the opening 3 changes to the impurity doped region 6. In contrast, in FIG. 2B, since the impurity absorption film 5A is thick, the whole thickness does not change to the impurity doped region 6, but a portion of the impurity absorption film 5A is left on the impurity doped region 6. Similarly, a portion of the impurity absorption film 5A is left on the (La, Sr)TiO$_3$ film 7.

The impurity doped region 6 of (La, Sr)TiO$_3$ is formed to a thickness of about 7.5 nm in the surface layer of the SrTiO$_3$ substrate at the region where the opening 3 is formed, and a portion of the SrTiO$_3$ film 5A of about 17.5 nm thick is left on the impurity doped region 6.

Figure 2C:
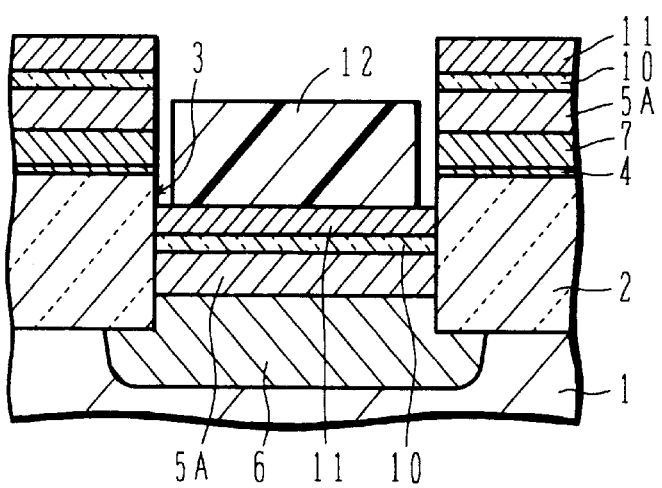

As shown in FIG. 2C, on the left impurity absorption film 5A, a barrier layer 10 and a superconductive layer 11 are formed in this order. The barrier layer 10 is made of In$_2$O$_3$ and is about 10 nm thick, and the superconductive layer 11 is made of YBa$_2$Cu$_3$O$_{7-x}$ (YBCO) and is about 50 nm thick. Depositing the barrier layer 10 is performed, for example, by laser abrasion under the conditions of KrF excimer laser at an energy density of 2J/cm$^2$, a substrate temperature of 860° C., and an atmospheric pressure of 10 mTorr. Depositing the superconductive layer 11 is performed, for example, by laser abrasion under the conditions of KrF excimer laser at an energy density of 3J/cm$^2$, a substrate temperature of 830° C., and an atmospheric pressure of 10 mTorr.

A resist pattern 12 is formed covering the area of the bottom of the opening 3 excepting the area close to the edge thereof. The area close to the edge of the opening 3 is not covered with the resist pattern 12 in order to retain a position alignment margin.

Figure 2D:
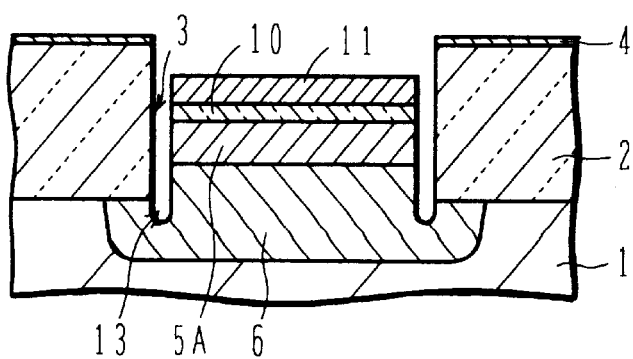

As shown in FIG. 2D, by using the resist pattern as a mask, the superconductive layer 11, barrier layer 10, SrTiO$_3$ film 5A, and (La, Sr)TiO$_3$ film 7 respectively formed on the upper surface of the mask layer 2 are removed by ion milling using Ar. Thereafter, the resist pattern 12 is removed. The area of the bottom of the opening 3 not covered with the resist pattern 12 is also etched and a groove 13 is formed. At the region where the opening 3 is formed, a lamination structure is formed which includes the SrTiO$_3$ substrate, impurity doped region 6, SrTiO$_3$ region 5A, barrier layer 10, and superconductive film 11.

In the process of the embodiment shown in FIG. 2A, the impurity absorption film SA of SrTiO$_3$ is deposited sufficiently thicker than the impurity supply film 4 of LaTiO$_3$. Therefore, as shown in FIG. 2B, the impurity doped region 6 can be formed which is thin with La atoms being doped to a certain depth from the SrTiO$_3$ surface. The impurity distribution in the depth direction from the SrTiO$_3$ surface can be approximated by a delta function.

Next, with referent to FIGS. 3A to 3E, the operation of a superconductive electronic circuit device using the lamination structure shown in FIG. 2D will be described.

Figure 3A:
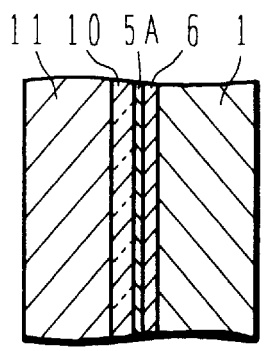
FIGS. 3A and 3B are cross sectional views of a lamination structure containing a dielectric oxide material layer fabricated by the second embodiment method and a lamination structure without a doped layer respectively.

FIG. 3A shows a lamination structure formed inside of the opening 3 shown in FIG. 2D. Sequentially from the right side of FIG. 3A, the SrTiO$_3$ substrate 1, impurity doped region 6, SrTiO$_3$ film 5A, barrier layer 10, and superconductive film 11 are laminated. The SrTiO$_3$ substrate 1 and SrTiO$_3$ film 5A are doped with n-type impurities such as Nb to provide them with n-type conductivity.

Figure 3B:
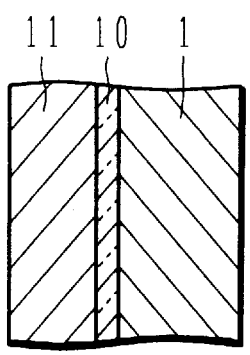

FIG. 3B shows a lamination structure of a barrier layer 10 of In$_2$O$_3$ directly formed on an n-type SrTiO$_3$ substrate 1 and a superconductive film 11 of YBCO formed on the barrier layer 10. This lamination structure was formed for the comparison with the voltage/current characteristics of the lamination structure shown in FIG. 3A.

Figure 3C:
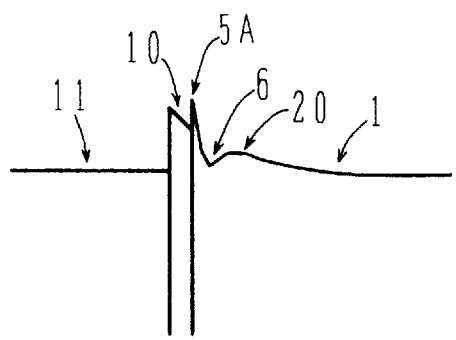
FIGS. 3C and 3D are energy band diagrams of the respective lamination structures shown in FIGS. 3A and 3B respectively.
Figure 3D:
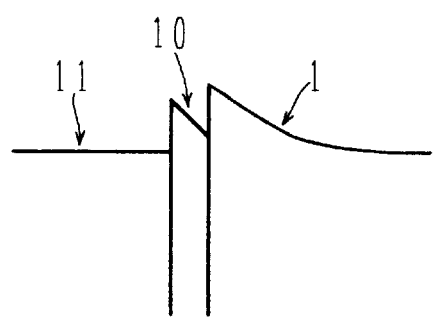

FIGS. 3C and 3D are energy band diagrams of the lamination structures shown in FIGS. 3A and 3B at the conduction band edge respectively. Reference numerals affixed to the solid line indicating the conduction band edge in the energy band diagrams correspond to respective layers of the lamination structures shown in FIG. 3A and 3B.

If the barrier layer 10 is formed directly on the surface of the SrTiO$_3$ substrate 1 as shown in FIG. 3B, the energy level at the conduction band edge of the SrTiO$_3$ substrate 1 gradually lowers at the position remoter from the interface with the barrier layer 10, as shown in FIG. 3D. In contrast, if the impurity doped region 6 is inserted as shown in FIG. 3A, a potential well is formed in the impurity doped region 6 as shown in FIG. 3C. Near at the interface between the impurity doped region 6 and SrTiO$_3$ substrate 1, a low potential barrier 20 is formed.

Figure 3E:
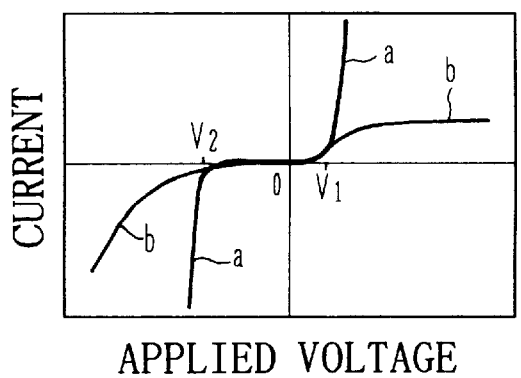
FIG. 3E is a graph showing the current/voltage characteristics of the lamination structures shown in FIGS. 3A and 3B.

FIG. 3E shows the voltage/current characteristics between the SrTiO$_3$ substrate 1 and superconductive film 11 of the lamination structures shown in FIGS. 3A and 3B. The abscissa represents an applied voltage with the SrTiO$_3$ substrate 1 being set to a positive side, and the ordinate represents current, both being in an arbitrary scale. Curves a and b correspond to currents flowing through the lamination structures shown in FIGS. 3A and 3B respectively.

As a positive voltage is applied to the lamination structure shown in FIG. 3B, a large electric field is generated in the barrier layer 10 made of In$_2$O$_3$ having a smaller dielectric constant than SrTiO$_3$. Therefore, a slope of the conduction band edge of the barrier layer becomes sharp. As a voltage V1 is applied, electrons in the superconductive film 11 tunnel through the barrier layer 10 and move to the potential well near at the interface between the barrier layer 10 and SrTiO$_3$ substrate 1. Electrons having an energy larger than the potential barrier between the barrier layer 10 and the SrTiO$_3$ substrate 1 flow into the SrTiO$_3$ substrate 1. In this manner, as a voltage larger than the voltage V1 is applied, current gradually increases.

As a positive voltage is applied to the lamination structure shown in FIG. 3A, a large electric field is generated in the barrier layer 10 similar to the lamination structure shown in FIG. 3B. As the voltage V1 is applied, electrons in the superconductive film 11 tunnel through the barrier layer 10 and SrTiO$_3$ film 5A and reach the impurity doped region 6. As shown in FIG. 3C, since the potential barrier 20 is smaller than that between the barrier layer 10 and SrTiO$_3$ substrate 1 shown in FIG. 3D, most of tunneled electrons flow into the SrTiO$_3$ substrate 1. Therefore, as an applied voltage exceeds the voltage V1, current increases abruptly.

As a negative voltage is applied to the lamination structure shown in FIG. 3B, the conduction band edge of the SrTiO$_3$ substrate 1 becomes near horizontal. Since the potential barrier of electrons in the SrTiO$_3$ substrate 1 lowers, current increases as the applied negative voltage increases.

As a negative voltage is applied to the lamination structure shown in FIG. 3A, the conduction band edge of the SrTiO$_3$ substrate 1 becomes near horizontal similar to the lamination structure shown in FIG. 3B. Since the potential barrier 20 of electrons in the SrTiO$_3$ substrate 1 is low, electrons in the SrTiO$_3$ substrate 1 flow into the impurity doped region 6 even if a small negative voltage V2 is applied. Electrons flowed into the impurity doped region 6 tunnel through the SrTiO$_3$ film 5A and barrier layer 10 and reach the superconductive film 11. Therefore, current abruptly increases as the applied voltage exceeds V2.

As shown in FIG. 3A, by forming a potential well with doped impurities at a certain depth from the interface between the SrTiO$_3$ film 5A and barrier layer 10, a diode can be realized which has the voltage/current characteristics showing an abrupt increase in current at the applied voltage in excess of the threshold value as indicated by the curve a shown in FIG. 3E.

In the embodiment shown in FIGS. 2A to 2D, In$_2$O$_3$ is used for the barrier layer. Other dielectric materials may be used. In order to generate a large electric field in the barrier layer, it is preferable to set the dielectric constant of the barrier layer smaller than of the substrate.

In the above two embodiments, the impurity supply film for supplying impurities such as La is formed on the surface of the SrTiO$_3$ substrate 1, and on this impurity supply film, the SrTiO$_3$ film is formed for absorbing La atoms not diffused into the substrate. It is therefore possible to prevent the impurity supply film from being left on the surface of the SrTiO$_3$ after the impurity diffusion. By adjusting the thickness of the impurity supply film for absorbing La atoms, the SrTiO$_3$ film may not be left on the surface of the diffusion region 6 as shown in FIG. 1B, or the SrTiO$_3$ film 5A may be left on the surface of the diffusion region 6 as shown in FIG. 2B.

In the above embodiments, SrTiO$_3$ is used as the substrate. Other dielectric oxide materials such as BaTiO$_3$ may also be used. Further, although LaTiO$_3$ is used for the impurity supply film, other materials such as La$_2$O$_3$ and Nb$_2$O$_5$ may be used. The lattice mismatch factor between the surface layer of the substrate and the impurity supply film is preferably set to 5% or lower.

If the impurity supply film is made of, for example, La$_2$O$_3$ and the substrate and impurity absorption film are made of SrTiO$_3$, La atoms and Sr atoms are replaced so that a lamination structure having an (La, Sr)$_2$O$_3$ region sandwiched between two (La, Sr)TiO$_3$ regions is formed. The (La, Sr)$_2$O$_3$ region can be expected that it does not hinder the motion of carriers because it is as very thin as carriers can tunnel therethrough.

In the above embodiments, although CeO$_2$ is used for the mask layer, other materials may be used. The mask layer is preferably made of material having a diffusion coefficient of atoms to be diffused into the surface layer of the substrate smaller then the substrate surface layer.

The method of controlling conductivity by doping impurities into the surface layer of dielectric oxide material may be applied to manufacture of various types of superconductive electronic circuit devices formed by a combination of dielectric oxide material and superconductive oxide material such as YBCO.

The present invention has been described in connection with the preferred embodiments. The invention is not limited only to the above embodiments. It is apparent to those skilled in the art that various modifications, improvements, combinations and the like can be made without departing from the scope of the appended claims.

We claim:

1. A method of manufacturing a dielectric oxide lamination structure comprising the steps of:

depositing an impurity supply film made of dielectric oxide material on the surface of an underlying substrate having a surface layer made of different dielectric oxide material;

depositing an impurity absorption film made of the same dielectric oxide material as the surface layer of said underlying substrate, on said impurity supply film; and heating said underlying substrate to replace a fraction of at least one type of constituent atoms other than oxygen atoms in said impurity supply film by a fraction of at least one type of constituent atoms other than oxygen atoms in the surface layer of said underlying substrate and in said impurity absorption film, for the whole thickness of said impurity supply film.

2. A method according to claim 1, further comprising the step of:

forming a mask layer on the surface of said underlying substrate before said step of forming said impurity supply film, said mask layer having an opening at the region where constituent atoms are replaced at said heat treatment step, wherein said heat treatment step performs replacement of constituent atoms between said impurity supply film and the surface layer of said underlying substrate, only at the region where said opening is formed.

3. A method according to claim 1, wherein a lattice mismatch factor between the surface layer of said underlying substrate and said impurity supply film is 5% or smaller.

4. A method according to claim 3, wherein the surface layer of said underlying substrate and said impurity absorption film are made of SrTiO$_3$ or BaTiO$_3$, and said impurity supply film is made of a material selected from a group consisting of LaTiO$_3$, La$_2$O$_3$, and Nb$_2$O$_5$.

5. A method according to claim 4, wherein said mask layer is made of CeO$_2$.

6. A method according to claim 4, wherein said step of depositing said impurity absorption film deposits said impurity absorption film under the conditions of a substrate temperature of 500° C. or higher and an oxygen atmospheric partial pressure of 1×10$^{-1}$ Torr.

7. A method according to claim 1, wherein said steps of depositing said impurity supply film and said impurity absorption film deposit said impurity supply film and said impurity absorption film under the condition of a substrate temperature of 500° C. or higher.

8. A method according to claim 1, wherein a thickness of said impurity absorption film to be deposited by said step of depositing said impurity absorption film is set so that at said heat treatment step, a fraction of at least one type of constituent atoms in said impurity absorption film is replaced for the whole thickness thereof until a fraction of at least one type of constituent atoms in said impurity supply film is replaced for the whole thickness thereof.

9. A method according to claim 1, wherein a thickness of said impurity absorption film to be deposited by said step of depositing said impurity absorption film is set so that at said heat treatment step, a fraction of at least one type of constituent atoms in said impurity absorption film is replaced only for the deep region thereof when a fraction of at least one type of constituent atoms in said impurity supply film is replaced for the whole thickness thereof.

10. A method according to claim 4, wherein said steps of depositing said impurity supply film and said impurity absorption film deposit said impurity supply film and said impurity absorption film under the condition of a substrate temperature of 500° C. or higher.

11. A method according to claim 4, wherein a thickness of said impurity absorption film to be deposited by said step of depositing said impurity absorption film is set so that at said heat treatment step, a fraction of at least one type of constituent atoms in said impurity absorption film is replaced for the whole thickness thereof until a fraction of at least one type of constituent atoms in said impurity supply film is replaced for the whole thickness thereof.

12. A method according to claim 4, wherein a thickness of said impurity absorption film to be deposited by said step of depositing said impurity absorption film is set so that at said heat treatment step, a fraction of at least one type of constituent atoms in said impurity absorption film is replaced only for the deep region thereof when a fraction of at least one type of constituent atoms in said impurity supply film is replaced for the whole thickness thereof.

13. A method of manufacturing a dielectric oxide lamination structure comprising the steps of:

depositing a $LaTiO_3$ film on the surface of a substrate having a surface layer made of $SrTiO_3$;

heating said substrate to replace a fraction of Sr atoms in said surface layer by a fraction of La atoms in said $LaTiO_3$ film;

depositing a $SrTiO_3$ film on said $LaTiO_3$ film; and heating said underlying substrate to replace a fraction of La atoms in said $LaTiO_3$ film by a fraction of Sr atoms in said $SrTiO_3$ film, for the whole thickness of said impurity supply film.

14. A method of manufacturing a dielectric oxide lamination structure comprising the steps of:

depositing an impurity supply film made of dielectric oxide material on the surface of an underlying substrate having a surface layer made of different dieletric oxide material;

depositing an impurity absorption film made of the same dielectric oxide material as the surface layer of said underlying substrate, on said impurity supply film; and heating said underlying substrate to diffuse constituent atoms other than oxygen atoms between said impurity supply film and both said impurity absorption film and a surface of said underlying substrate to form an impurity doped region throughout said impurity absorption film, said impurity supply film, and said surface of said underlying substrate.

* * * * *